United States Patent [19]

Cook et al.

[11] Patent Number: 4,554,047

[45] Date of Patent: Nov. 19, 1985

[54] DOWNSTREAM APPARATUS AND TECHNIQUE

[75] Inventors: Joel M. Cook, Union Township, Hunterdon County; Daniel L. Flamm, Chatham Township, Morris County, both of N.J.; Edward H. Mayer, North Andover, Mass.; Bernard C. Seiler, Kingston, N.H.

[73] Assignees: AT&T Bell Laboratories, Murray Hill; AT&T Technologies, Berkeley Heights, both of N.J.

[21] Appl. No.: 660,048

[22] Filed: Oct. 12, 1984

[51] Int. Cl.[4] .................... H01L 21/306; B44C 1/22; C03C 15/00; C03C 25/06
[52] U.S. Cl. .................................. 156/643; 156/345; 156/646; 156/657; 204/192 E; 204/298
[58] Field of Search ............ 156/643, 646, 657, 659.1, 156/662, 345; 252/79.1; 204/164, 192 E, 298; 134/1; 427/38, 39

[56] References Cited

U.S. PATENT DOCUMENTS

| | | | |
|---|---|---|---|
| 4,384,938 | 5/1983 | Desilets et al. | 156/345 X |
| 4,492,610 | 1/1985 | Okano et al. | 156/643 |
| 4,512,868 | 4/1985 | Fujimura et al. | 204/298 |

Primary Examiner—William A. Powell
Attorney, Agent, or Firm—Bruce S. Schneider

[57] ABSTRACT

The use of a particular configuration in a downstream etching apparatus and technique allows the rapid and economical treatment of a plurality of semiconductor substrates. Additionally, through the use of this technique, global and localized loading effects are avoided. The downstream apparatus utilizes a discharge region that is relatively large compared to the volume occupied by the substrates. Additionally, the concentration of the etchant species in the effluent is maintained at a level that is of the same order as that produced in the discharge region.

9 Claims, 1 Drawing Figure

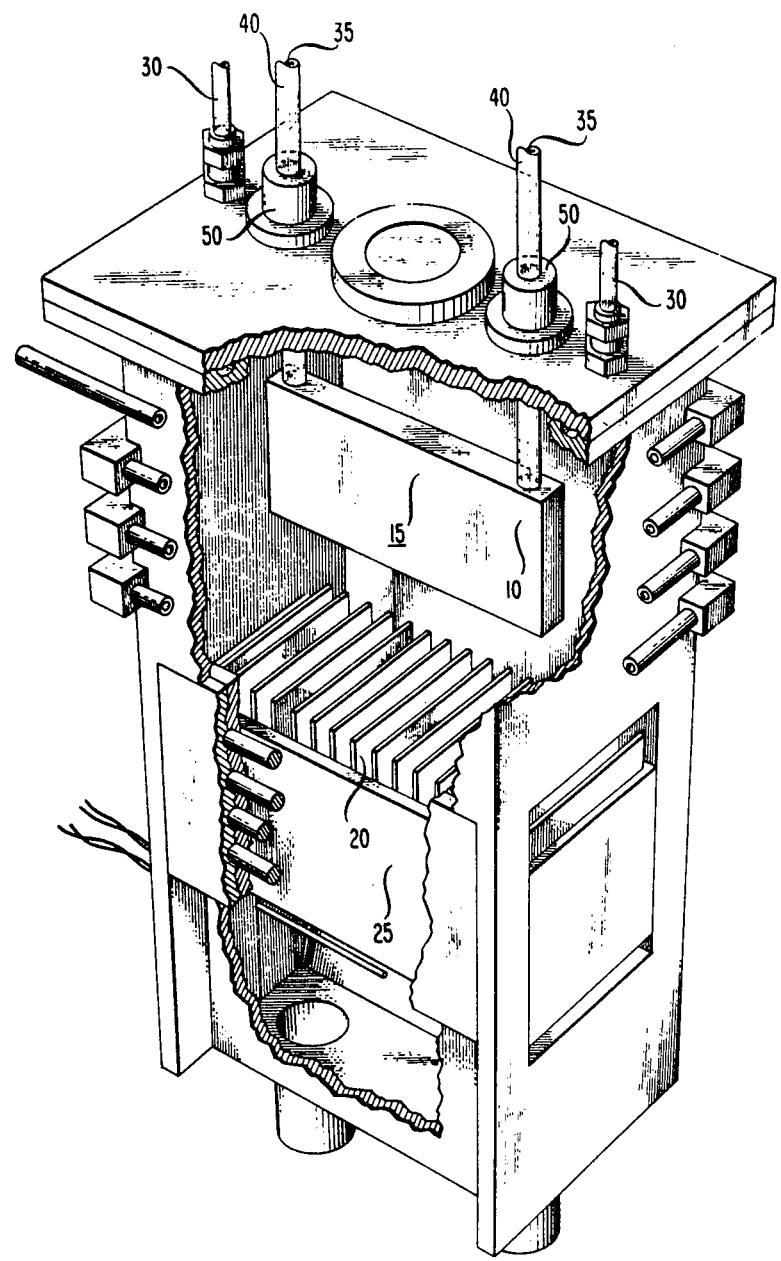

DOWNSTREAM APPARATUS AND TECHNIQUE

BACKGROUND OF THE INVENTION

1. Field of the Invention

This invention relates to semiconductor material processing and, in particular, to the etching of semiconductor materials.

2. Art Background

Removal techniques, e.g., etching and cleaning, are universally practiced on semiconductor materials, metal materials, and/or dielectric materials in the production of electronic devices and/or materials. Because of the importance of these procedures, extensive research has been expended in improving established techniques and developing novel approaches. Through this research, processing times have been significantly diminished, and the quality of these processes has been substantially improved.

One approach that has been used for decreasing processing times is the simultaneous treatment of a plurality of substrates, e.g., semiconductor substrates or semiconductor substrates that have been processed and that have various levels including metal, semiconductor, and/or insulator regions. A significant problem, however, occurs when a plurality of substrates is treated. (Substrates, for the purpose of this invention, comprehend any body upon which a device is fabricated, including, but not limited to, devices in process, substrates utilized in semiconductor device fabrication, and substrates utilized in the manufacture of hybrid integrated circuits.) This problem, denominated the loading effect, is characterized by a change in removal characteristics produced by the presence of a substrate area significantly larger than that of a single substrate, i.e., the presence of several substrates. The loading effect often is manifested both locally and globally. The local loading effect leads to non-uniformities across each substrate. For example, in integrated circuit fabrication, often more material at the periphery of a substrate is removed than at the center of the substrate with a concomitant unacceptable non-uniformity.

In the global loading effect, all substrates of a batch are etched at the same rate and yet this rate differs from the rate achieved when a different number of substrates is treated. This effect is quite disadvantageous since the etching conditions must be adjusted or the time varied for the particular number of substrates that is to be treated. The result of each loading effect is either a significant increase in processing time, and thus expense, or the production of substrates that are unacceptable for electronic devices.

Since the processing of a plurality of substrates presents many difficulties, techniques are being employed that are adapted to the processing of individual substrates. For example, excellent etching is produced using species generated in a plasma and directed by electric fields towards the substrate that is immersed in the plasma. Exemplary processes and apparatuses are described in, for example, U.S. Pat. No. 4,383,885, issued May 17, 1983. A second approach that has been utilized and described in *Journal of the Electrochemical Society*, 129, S. Dzioba et al, page 2537 (1982), *Proceedings of the 7th Conference of Solid State Devices*, Y. Horiike and M. Shibagaki, Tokyo (1975), supplement to the *Japanese Journal of Applied Physics*, 15, page 13 (1976), and *Thin Film Processes*, Chapter V-2, C. M. Melliar-Smith and C. J. Mogab, Academic Press, edited by J. L. Vossen and W. Kern, New York (1978) is the separation of the substrate from the region where the etching species is produced. In such a process, a discharge is established in one region and the etching species produced in this discharge is allowed, generally through diffusive and bulk flow processes, to leave the discharge region and to induce etching or cleaning of the substrates in a second, disjoint region. This downstream process has been employed generally to prevent the plasma from damaging the substrate. For example, when a substrate is present in the plasma region, it is subjected to bombardment by kinetically energetic species. These energetic species often induce sputtering of substrate material. The radiation and fields associated with the plasma also have the potential for inducing damage. Despite the reduction of damage to the substrate, attempts to expand downstream removal techniques to multiple substrates have led to loading effects, and thus the techniques presently employed remain, to a large extent, repetitive single substrate methods.

SUMMARY OF THE INVENTION

By carefully configuring an apparatus and controlling the removal process, e.g., the etching and/or cleaning process, the advantages of downstream removal are producible with multiple substrate treatment while the disadvantages associated with the loading effect are avoided, i.e., etch rates across a substrate and from substrate to substrate do not vary more than 20 percent. Highly desirable results are produced by ensuring that (1) the substrates do not contact or are not surrounded by the plasma, (2) the volume of the discharge region is at least 200 percent of the volume occupied by the substrates, and (3) the etchant species concentration exiting the etchant chamber when no substrates are present should be not less than 25 percent of the etchant species concentration at the boundary of the discharge region. By conforming to these three criteria up to 48, substrates have been etched without substantial loading effect difficulties, and this number has not been limited, except by weight and space considerations.

BRIEF DESCRIPTION OF THE DRAWING

The FIGURE is illustrative of an apparatus involved in the invention.

DETAILED DESCRIPTION

The downstream reactor and reaction process of the invention should satisfy three criteria. First, the substrate should not contact or be surrounded by the plasma. To fully define the limits of this criterion, it is necessary to specify the region that is considered occupied by the plasma. In particular, the discharge region is defined by all points that have a luminosity due to the discharge and that are at least 5 percent as intense as the most luminescent point produced by the discharge. The luminosity of a point is easily measured using conventional detectors such as photomultipliers or photodiodes combined with, for example, bandpass filters. Thus, to define the discharge region, all the luminescent points produced by the discharge are measured. The point of highest luminosity is taken as a reference, and the discharge volume is defined by all points whose luminosity is greater than or equal to 5 percent of this highest value.

Many configurations satisfy the first criterion. For example, the configuration shown in the FIGURE is satisfactory and easily employed. It should be noted that the means utilized for producing the discharge generally determines its size. For example, discharges are producible by utilizing r.f. power, dc power, or microwave power. The region into which power is channeled by expedients such as electrodes, 10, is generally representative of the area in which luminescence occurs. (See *Techniques and Applications of Plasma Chemistry*, J. R. Hollahan and A. T. Bell, Wiley-Interscience, New York (1974) for a description of various techniques useful for producing a discharge suitable for removal techniques.) The substrates, 20, are then located in a spatial region that is disjoint from the discharge region and which is not surrounded by the discharge region. For example, a configuration is not suitable where the substrates are surrounded by the discharge. In contrast, the configuration of the FIGURE is suitable since the discharge, in area 15, produced by power introduced through electrode, 10, is disjoint from the substrates, 20, and does not surround the substrates.

Since reactive species should reach the surface of the substrate to induce removal, it is not desirable that the substrates contact each other. Generally, the substrates are held apart by a holder, 25, that is typically formed from an inert material such as aluminum or fluorocarbon. The spacing between the substrates chosen to ensure reactive species contact is not critical. However, it is generally desirable to have spacings in the range 5 to 15 mm. Larger spacings are undesirable since they require excessive space, and smaller spacings are undesirable because they restrict mass transport and cause excessive pressure drop. It is also typically advantageous to position the substrates so that they are parallel or within 5 degrees of parallel. Use of a non-parallel configuration, although not precluded, is not as desirable because it induces non-uniform gas flow.

To avoid the loading effect, a second criterion should also be satisfied. In particular, the volume of the discharge region, as previously defined, should be at least 100 percent, preferably at least 200 percent, of the volume occupied by the substrates. The volume of the substrates is defined by the region encompassed by connecting every point on the periphery of each substrate with every point on the periphery of every other substrate. The outer boundaries of this subtended region are the ambit of the substrates. Typically, plasma discharge volumes in the range 2 to 10 liters are utilized. Larger volumes require excessive power while smaller volumes are less power efficient. Therefore, the substrates for typical operating parameters should generally occupy a volume in the range 1 to 5 liters. Silicon substrates typically have a diameter in the range 100 to 150 mm. Therefore, to satisfy the volume requirements for typical operating parameters, average spacings between the substrates are generally in the range 5 to 10 mm for the simultaneous processing of 10 to 30 silicon substrates.

The third criterion is satisfied if the concentration of the reactive species in the effluent exiting the reaction chamber, i.e., the chamber in which the substrates are located, when no substrates are present, is not less than 25 percent of the etchant species concentration at the boundary of the previously defined discharge region. The concentration levels at the removal chamber exit and at the periphery of the discharge region are measurable using conventional detectors such as catalytic probe detectors. (Catalytic probe detectors and their use are described in *Canadian Journal of Chemistry*, 37, L. Elias et al, page 1690 (1959) and *Progress in Reaction Kinetics*, 1, F. Kaufman, Pergamon Press, New York (1961). A reactive species is defined as a species which causes removal of material from the region to be etched or cleaned by processes including ablation by abstraction, insertion, and/or reaction and desorption. If more than one reactive species is generated, then the satisfaction of the third criterion is determined by summing the reactive species concentrations. For example, in the etching of silicon, a gaseous discharge is produced in (1) $CF_4$ combined with oxygen or (2) $NF_3$. This discharge induces the formation of fluorine atom etchant species which, in turn, produces etching through the contemplated reaction of fluorine atoms with silicon to form gaseous $SiF_4$.

The distance between the discharge region and the substrate, as well as the discharge power and gas pressure and flow, all affect the satisfaction of the third criterion. It is typically desirable to utilize discharge powers in the range 100 to 1500 Watts with a distance between the discharge and the substrate in the range 1 to 10 cm (measured between the downstream boundary of the discharge and the upstream edge of the substrate) to yield suitable concentrations of reactive species. The concentration of the gas that is the precursor to the reactive species, i.e., that undergoes an interaction in the plasma to produce a species capable of reaction, also affects this third criterion. Typically, for the power levels and discharge and substrate distances discussed, etchant precursor gas pressures in the range 0.5 to 5 Torr are desirable. Higher pressures generally lead to inhomogeneities, while lower pressures produce large proportionate pressure differentials across the substrates and tend to induce sputtering of material from the chamber walls. It is also possible to combine the gas reactive species precursor with an inert gas. Typically, inert gas such as He, Ar, and $N_2$ are utilized, and total pressures of inert gas and precursor gas in the range 1 to 10 Torr are suitable.

As previously discussed, the reactive species are caused to flow from the discharge region to the substrates. This flow is easily accomplished by producing a pressure differential through conventional techniques such as the use of a vacuum pump. Other means, such as the use of diffusion of the species from one concentration region to a second, are also possible.

Although the criteria previously discussed are those that should be satisfied for the practice of the subject invention, there are other expedients that are useful, although not essential, to the invention. For example, it is desirable to coat the reaction chamber walls with a fluorocarbon material such as Teflon TM or Kynar TM. This material retards the recombination of reaction species and therefore aides in the satisfaction of the third criterion. It is also desirable to use a high frequency in the range 13.56 to 27.12 MHz for producing an r.f. gas discharge. The use of high frequencies produces a more uniform plasma and results in a low sheath voltage. This low voltage limits the potential energy of various gas species and thus reduces any sputtering that is present.

The following examples are illustrative of the invention.

EXAMPLE 1

Forty-eight aluminum oxide ceramic substrates measuring 3.75 inches×4.50 inches×20 mils were firecleaned in an air ambient at 1500 degrees C. An AZ-1350J resist solution, as provided by American Hoechst Company, was diluted 4:1 in AZ thinner, also provided by American Hoechst. Each substrate was spun at 200 rpm, and a sufficient amount of this solution was placed on each of the spinning substrates to cover it. The speed of the substrates was then increased to 3000 rpm, and the spinning was continued for approximately 25 seconds. This procedure resulted in a resist layer of about 1 μm in thickness. The resists were baked at approximately 80 degrees C. in an air ambient oven and maintained at this temperature for approximately 30 minutes. The substrates were placed in the substrate holder, 25, of the etching apparatus, and the apparatus was evacuated to a pressure of approximately 20 mTorr. The spacing between the substrates in the substrate holder was approximately 3/16 of an inch.

A mixture of 3.6 mole percent $CF_4$ in oxygen was introduced through inlets, 30. The combined flow through the inlets was approximately 470 sccm. The resulting pressure in the discharge chamber was approximately 0.6 Torr. Approximately 400 Watts of r.f. power at 27.12 MHz was applied to the electrode, 10, through leads, 40, while cooling water was supplied to the electrodes through the inlets, 35, in leads, 40. (The electrode was electrically isolated from the case and vacuum sealed from the ambient by insulators, 50.) Etching was continued until the resist layer was removed. Etching was uniform in the two directions perpendicular to the gas flow direction and showed a slight non-uniformity in the direction parallel to the flow direction due to inadequate bulk flow velocity. This slight non-uniformity—evidenced by a tendency to strip at a greater rate at the periphery of the substrate closest to the discharge region and oriented normal to the flow direction—is rectifiable by increasing the pumping speed and gas flow rate.

EXAMPLE 2

The procedure of Example 1 was utilized except the substrate was coated with 400 Angstroms of tantalum nitride ($Ta_2N$), rather than with the resist material. Additionally, the gas introduced through inlets, 30, was 12 mole percent oxygen in $CF_4$. Removal of the tantalum nitride proceeded essentially uniformly in all directions.

What is claimed is:

1. A process for fabricating a device including the procedure of removing material from a plurality of substrates comprising the steps of producing reactive species in a plasma and directing said species to said substrate and subsequently into an effluent wherein said substrate is disjoint from and not surrounded by said plasma CHARACTERIZED IN THAT the volume of said plasma is at least 200 percent as large as the volume occupied by said substrates, and the concentration of said etchant species measured in said effluent in the absence of said substrates is at least 25 percent of the concentration of said species at the periphery of said plasma.

2. The process of claim 1 wherein said plasma comprises an r.f. discharge.

3. The process of claim 1 wherein said substrate comprises silicon.

4. The process of claim 3 wherein said etchant species comprises fluorine atoms.

5. The process of claim 1 wherein said etchant species comprises oxygen atoms.

6. The process of claim 1 wherein said material comprises silicon.

7. The process of claim 1 wherein said material comprises a resist.

8. The process of claim 1 wherein said device comprises a hybrid integrated circuit.

9. The process of claim 1 wherein the average spacing between said multiplicity of substrates is in the range 5 to 15 mm.

* * * * *